(12) United States Patent
Baldwin et al.

(10) Patent No.: US 6,560,448 B1
(45) Date of Patent: May 6, 2003

(54) DC COMPENSATION SYSTEM FOR A WIRELESS COMMUNICATION DEVICE CONFIGURED IN A ZERO INTERMEDIATE FREQUENCY ARCHITECTURE

(75) Inventors: Keith R. Baldwin, Melbourne Beach, FL (US); Patrick J. Landy, Melbourne, FL (US); Mark A. Webster, Melbourne Beach, FL (US); R. Douglas Schultz, Melbourne, FL (US); John S. Prentice, Palm Bay, FL (US)

(73) Assignee: Intersil Americas Inc., Milpitas, CA (US)

( * ) Notice: Subject to any disclaimer, the term of this patent is extended or adjusted under 35 U.S.C. 154(b) by 331 days.

(21) Appl. No.: 09/678,901

(22) Filed: Oct. 2, 2000

(51) Int. Cl.[7] ............................... H04B 1/06
(52) U.S. Cl. .................. 455/234.1; 455/324; 455/303; 375/341
(58) Field of Search ............... 455/324, 296, 455/303, 305, 232, 234.1; 375/341

(56) References Cited

U.S. PATENT DOCUMENTS

| | | | | |
|---|---|---|---|---|
| 5,212,827 A | * | 5/1993 | Meszko et al. | 455/324 |
| 5,241,702 A | * | 8/1993 | Dent | 455/303 |
| 5,661,761 A | | 8/1997 | Iwamatsu | 375/344 |
| 5,901,347 A | * | 5/1999 | Chambers et al. | 455/234.1 |
| 6,324,389 B1 | * | 11/2001 | Vaisanen | 455/324 |
| 6,473,471 B2 | * | 10/2002 | Lindquist et al. | 375/341 |

FOREIGN PATENT DOCUMENTS

| | | | |
|---|---|---|---|
| WO | WO 95/30275 | 11/1995 | H03G/3/30 |
| WO | WO 97/06604 A | 2/1997 | |

OTHER PUBLICATIONS

A. Abidi, "Direct–Conversion Radio Transceivers for Digital Communications", *IEEE Journal of Solid–State Circuits*, vol. 30, No. 12, Dec. 1995, pp. 1399–1410.
B. Razavi, "Design Considerations for Direct–Conversion Receivers", *IEEE Transactions on Circuits and Systems—II: Analog and Digital Signal Processing*, vol. 44, No. 6, Jun. 1997, pp. 428–435.
J. Cavers et al., "Adaptive Compensation for Imbalance and Offset Losses in Direct Conversion Transceivers", *IEEE Transactions on Vehicular Technology*, vol. 42, No. 4, Nov. 1993, pp. 581–588.
A. Bateman et al., "Direct Conversion Transceiver Design for Compact Low–Cost Portable Mobile Radio Terminals", *IEEE Veh. Tech. Conf.*, 1989, pp. 57–62.
S. Sampei et al.,"Adaptive DC–Offset Compensation Algorithm for Burst Mode Operated Direct Conversion Receivers", IEEE Veh. Tech. Conf., 1992, pp. 93–96.

* cited by examiner

Primary Examiner—Thanh Cong Le
Assistant Examiner—Lana Le
(74) Attorney, Agent, or Firm—Gary R. Stanford

(57) ABSTRACT

A wireless communication device including a radio frequency (RF) circuit, a ZIF transceiver and a baseband processor. The ZIF transceiver includes an RF mixer circuit that converts the RF signal to a baseband input signal, a summing junction that subtracts a DC offset from the baseband input signal to provide an adjusted baseband input signal, and a baseband amplifier that receives the adjusted baseband input signal and that asserts an amplified input signal based on a gain adjust signal. The baseband processor includes gain control logic, DC control logic and a gain interface. The gain control logic receives the amplified input signal, estimates input signal power and asserts the gain adjust signal in an attempt to keep the input signal power at a target power level. The DC control logic estimates an amount of DC in the amplified input signal and provides the DC offset in an attempt to reduce DC in the amplified input signal. The gain interface converts gain levels between the gain control logic and the DC control logic. The RF signal may include in-phase (I) and quadrature (Q) portions, where the RF mixer circuit splits I and Q baseband input signals from the RF signal. Operation is substantially identical for both I and Q channels. The DC control logic operates to remove or otherwise eliminate DC from the received signal that is provided to decoders in the baseband processor.

17 Claims, 3 Drawing Sheets

DC COMPENSATION SYSTEM FOR A WIRELESS COMMUNICATION DEVICE CONFIGURED IN A ZERO INTERMEDIATE FREQUENCY ARCHITECTURE

CROSS-REFERENCE TO RELATED APPLICATION(S)

The present application is related to U.S. Patent Application entitled "A Calibrated DC Compensation System For A Wireless Communication Device Configured In A Zero Intermediate Frequency Architecture", Ser. No. 09/677,975 filed concurrently herewith.

FIELD OF THE INVENTION

The present invention relates to wireless communications, and more particularly to a DC compensation system for a wireless communication device configured in a zero intermediate frequency (ZIF) architecture that utilizes a DC control loop to enable direct conversion of radio frequency signals to baseband frequency.

DESCRIPTION OF RELATED ART

Network communication is a growing area of technology both for business and home applications. A network system enhances communication and provides a suitable environment for enhanced productivity and capabilities both at home and in the workplace. The Internet for example, is a global, mostly wired, communication network that couples devices together on a world-wide basis that enables worldwide communication between any devices coupled to the Internet. The Internet enables access to a plurality of services, such as file sharing, faxing, chat, email and information access via websites to files, libraries, databases, computer programs, etc.

Many businesses and commercial entities include a relatively established and sophisticated network environment for enhanced productivity and communication. For example, Extranets or Intranets provide enhanced yet protected or secure communication to a selected group of people on the Internet. Many small businesses and homes are coupled to the Internet via some variation of local area network (LAN) or the like. It is becoming more advantageous and common for small businesses and home environments to include LAN capabilities to connect to the Internet or to access other services, such as file sharing, printing, faxing, etc. and to further enable communication such as via chat and email services, and the like and to provide access to common databases and libraries, etc. Many such small networks are connected through a set of wires. For example, a network may be established in a small office or home through standard phone wires. Phone wires are already available in each office of a business and in several rooms of a typical home. Technology also exists to establish network communications via power lines which are typically available in every room of a house. Many small offices and homes may alternatively be wired with network wires, such as a twisted-pair telephone wires with corresponding RJ-45 connectors utilized by various Ethernet embodiments.

Wired networks provide a certain level of convenience but have many limitations. Each device coupled to the network must be attached to a corresponding wire through which the network is established. The location of each device, therefore, is limited to enable access to the network wires. Cable management is also a significant issue, since devices must be placed to enable proper routing of wires. It is desired that the wires be conveniently placed and for aesthetic reasons, out of sight. Wires should be located in such a manner as to reduce or eliminate any chance of accidental interference or disconnect or hazards such as tripping. Once wired devices are properly placed, movement of the devices is very limited or otherwise not practical without substantial re-configuration or re-routing of the wires. Maintenance of wired network devices can be inconvenient and often requires that the wires be removed during service and then reconnected properly.

Certain wireless technologies are known, such as infrared technology. Infrared technology works well for certain applications, such as remote control systems or the like. For network applications, infrared technology is a relatively inexpensive option but has certain limitations, including limited bandwidth, range limitations, and line-of-sight issues. Infrared technology has been utilized in certain applications, such as access points (APs) and point to point relay nodes to extend a network down hallways and the like. For example, infrared devices are known for use in hospitals, hotels and other relatively large structures. The APs or nodes, however, are usually fixed and located in such a manner, such as on the ceiling, to avoid potential interference with physical objects. Due to line of sight issues, infrared technology is not particularly convenient for network communications at the end points of the network where human interaction is necessary.

Radio frequency (RF) technology appears to be the technology of choice for establishing a viable wireless local area network (WLAN). RF technology for LAN systems, however, is not particularly optimized for small office or home use. Wireless technology is established for industrial and commercial uses and applications such as courier services, vehicle rentals, warehouse operations and inventories, etc. The wireless embodiments for commercial and industrial applications are too expensive or otherwise specialized and thus are not suited for direct use in the small office or home environment.

The Bluetooth technology is being developed for application in the home or office. Bluetooth technology offers relatively limited bandwidth at very low cost to enable connectivity and network communications between certain communication devices, such as cellular phones, computer systems including notebook, laptop and desktop computers and further including other hand-held devices such as personal digital assistants (PDAs) or the like. The Bluetooth technology, however, has limited bandwidth and therefore relatively low data throughput capability. The consumer market demands higher data throughput and reliability such as is necessary for DVD and other multimedia applications.

The typical environment for a WLAN is very noisy and not optimal for wireless communications. For example, most homes include many electronic devices resulting in an electronically noisy environment that may interfere with WLAN communications, such as microwave ovens, garage door openers, radios, television sets, computer systems, etc. Further, the communication medium between wireless devices constantly changes. For example, most environments or rooms include multiple reflective surfaces creating multipath noise in the wireless environment. Furthermore, movement of items or devices or the like such as hands, bodies, jewelry, mouse pointers, etc. or activation of electronic devices, such as cooling fans or the like, affects the overall wireless communication path and potentially degrades wireless communication performance.

Low cost and low power wireless communication devices for enabling a WLAN system or the like for use at home or in the small business is desirable. It is further desired to provide low cost and low power wireless communication devices for any type of wireless system for any type of application. The system must be relatively robust with significant performance and be capable of significant data throughput.

SUMMARY OF THE INVENTION

The present invention combines a DC offset correction signal with an input modulated signal to form a properly DC adjusted input modulated signal. A DC compensation system for a wireless communication device configured in a zero intermediate frequency (ZIF) architecture according to the present invention includes a combiner that combines a DC offset signal from an input signal and that provides an adjusted input signal. The wireless communication device includes DC control logic that generates the DC offset signal, gain control logic that attempts to keep the input signal power at a target level, and a gain interface that converts gain levels between the gain control logic and the DC control logic.

In a primary signal path of the wireless device, a gain amplifier receives the adjusted input signal and provides an amplified input signal based on a gain adjust signal. The gain control logic includes a gain feedback circuit that receives the amplified input signal, that estimates input signal power and that provides the gain adjust signal in an attempt to maintain the input signal power at the target power level. The DC control logic includes a DC estimator that estimates a DC level in the amplified input signal and that provides a DC estimate signal. The DC control logic also includes a DC amplifier that receives the DC estimate signal and that provides the DC offset signal based on a gain conversion signal. It is noted that the gain of the DC amplifier may be less than one (e.g. 1/G) and may operate as an attenuator. It is understood that "amplification" includes the operation of attenuation. The gain interface includes a gain converter that receives the gain adjust signal and that provides the gain conversion signal to the DC amplifier.

The gain interface may perform one or more functions. In one embodiment, the gain converter converts between gain ranges of the gain amplifier and the DC amplifier. Alternatively, or in addition, the gain converter converts between logarithmic and linear gain scales when the gain amplifier has a logarithmic gain scale and the DC amplifier has a linear gain scale.

In a more specific embodiment, the wireless communication device includes a radio frequency (RF) circuit, a ZIF transceiver and a baseband processor. The RF circuit receives and provides an RF signal, and may include one or more antennas, switches, filters and matching networks to receive and deliver the RF signal to the transceiver. The ZIF transceiver includes an RF mixer circuit that converts the RF signal to a baseband input signal, a combiner that combines a DC offset from the baseband input signal to provide an adjusted baseband input signal, and a baseband amplifier that receives the adjusted baseband input signal and that asserts an amplified input signal based on a gain adjust signal. The baseband processor includes gain control logic, DC control logic and a gain interface. The gain control logic receives the amplified input signal, estimates input signal power and asserts the gain adjust signal in an attempt to keep the input signal power at a target power level. The DC control logic estimates an amount of DC in the amplified input signal and provides the DC offset in an attempt to reduce DC in the amplified input signal. The gain interface converts gain levels between the gain control logic and the DC control logic. The DC control logic operates to remove or otherwise eliminate DC from the received signal that is provided to conversion and decode logic in the baseband processor. The RF circuit and the ZIF transceiver generally operate with analog signals while the baseband processor primarily uses digital logic. Appropriate conversion devices are included to establish interfacing, such as analog to digital converters (ADC) and digital to analog converters (DAC). The RF signal may include in-phase (I) and quadrature (Q) portions, where the RF mixer circuit splits I and Q baseband input signals from the RF signal. Operation is substantially identical for both I and Q channels. Two separate summing junctions are provided, one each for the I and Q channels. The baseband amplifier includes separate I and Q channel baseband amplifiers, which are both controlled by the same gain adjust signal from the gain control logic to ensure proper I and Q channel tracking. Separate DC control logic and gain interfaces are provided for the I and Q channels, where operation is substantially the same. The DC control logic operates to remove or otherwise eliminate DC from the received signal that is provided to a spreading decoder and a packet decoder in the baseband processor.

A method of reducing DC in a wireless ZIF device includes converting a received radio frequency (RF) signal to a baseband signal, subtracting a DC offset from the baseband signal to achieve an adjusted baseband signal, amplifying the adjusted baseband signal based on a gain signal to achieve an amplified input signal, estimating a power level of an input baseband signal from the amplified input signal, adjusting the gain signal to achieve a target power level of the input baseband signal, measuring a DC level of the amplified input signal to obtain a DC estimate, amplifying the DC estimate based on a gain conversion signal to provide the DC offset, and generating the gain conversion signal based on the gain signal.

The method may further comprise converting between gain ranges and/or converting between different gain scales, such as between logarithmic and linear gain scales. The method may further include subtracting the DC offset from the baseband signal. The amplifying the DC estimate may comprise attenuating the DC estimate. The attenuating may further include inverting the DC estimate to provide the DC offset, where the DC offset is then added to the baseband signal.

It is appreciated that removal of the IF portion of a high performance wireless transceiver, with proper DC compensation, results in a relatively high performance, low cost wireless ZIF transceiver with reduced power requirements. The use of a DC compensation loop interfaced to the gain loop according to embodiments of the present invention achieves these goals. Such capability enables a WLAN system to be designed for use at home or in the small business that is relatively robust and that has significant performance with relatively high data throughput operation.

BRIEF DESCRIPTION OF THE DRAWINGS

A better understanding of the present invention can be obtained when the following detailed description of the preferred embodiment is considered in conjunction with the following drawings, in which.

Figure 1:
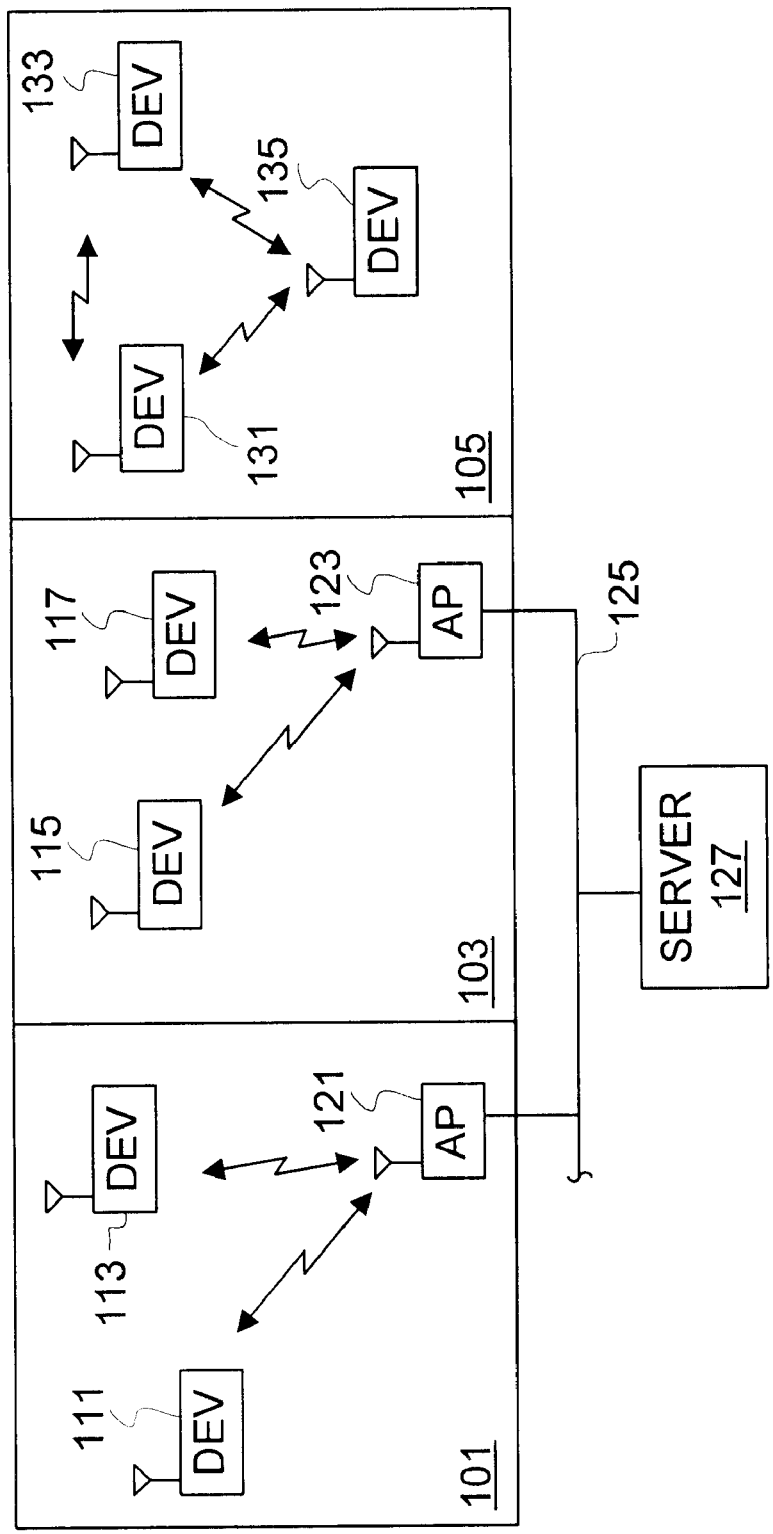
FIG. 1 is a block diagram of one or more wireless LANs generally illustrating operation of wireless devices implemented according to one or more embodiments of the present invention.

architecture and implemented according to an embodiment of the present invention that may be incorporated within any of the devices or access points of FIG. 1.

Figure 2:
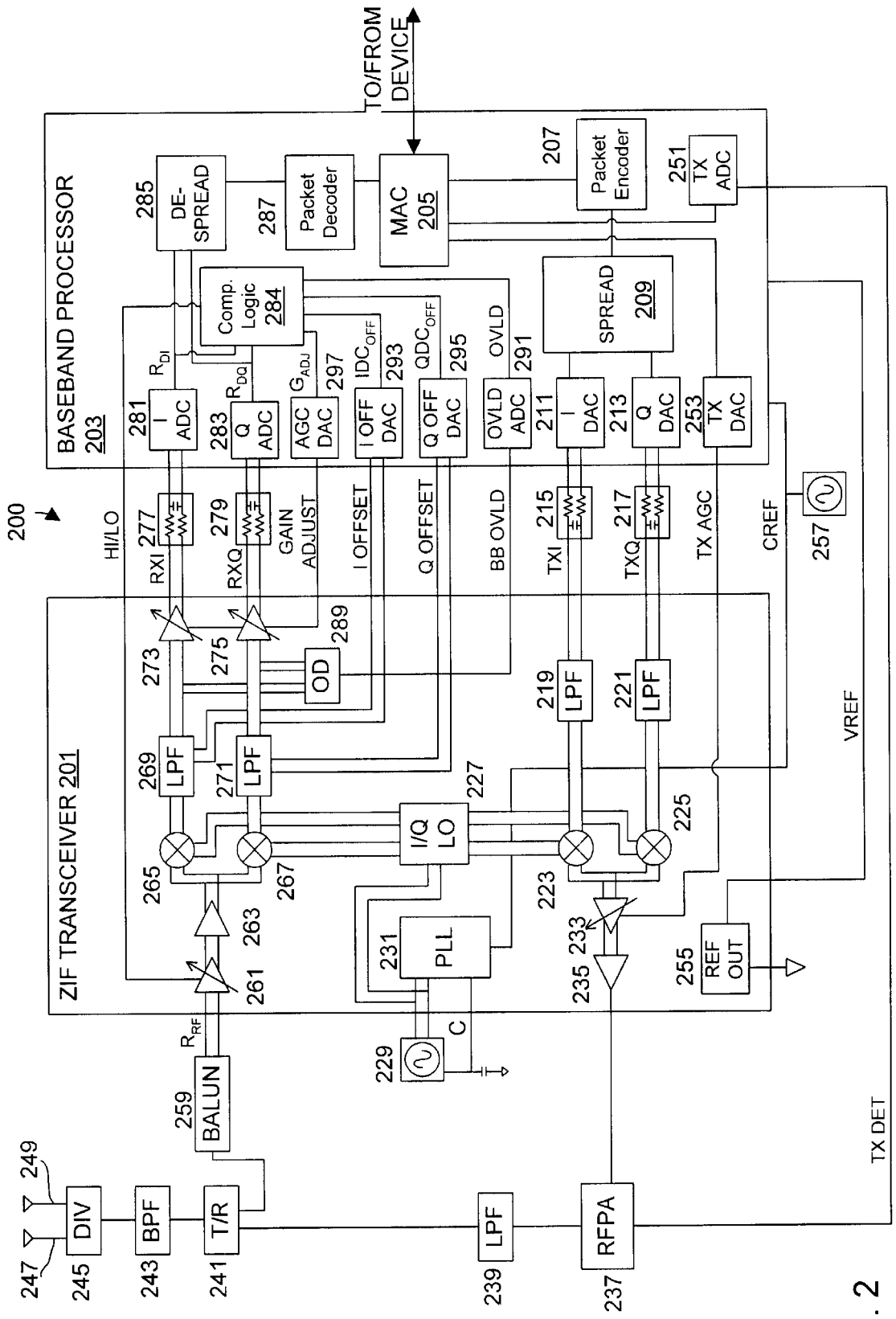
FIG. 2 is a simplified schematic and block diagram of a wireless transceiver in a Zero Intermediate Frequency (ZIF)
Figure 3:
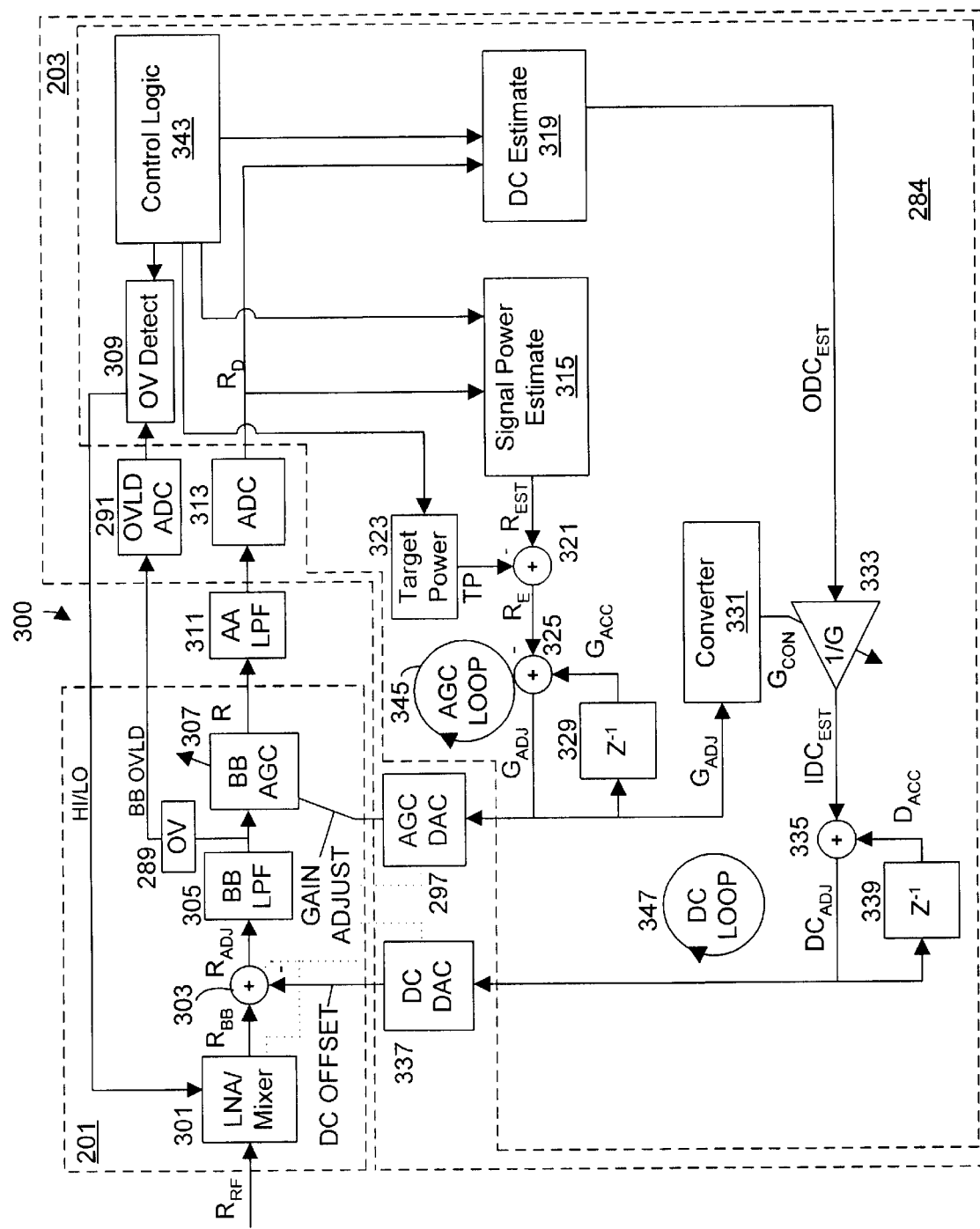

FIG. 3 is a block diagram of a compensation system utilized to control the gain of the received signal and to reduce or eliminate DC offsets in the wireless transceiver of FIG. 2.

DETAILED DESCRIPTION OF EMBODIMENT(S) OF THE INVENTION

FIG. 1 is a block diagram of one or more WLANs generally illustrating operation of wireless devices implemented according to one or more embodiments of the present invention. Although the present invention is illustrated for use with WLANs in exemplary embodiments, it is understood that the present invention applies for any radio or wireless communications and is not limited to WLAN applications. A first area 101 and a second area 103 represent separate compartments or divisions of a location such as offices within an office building or rooms within a house. The areas 101 and 103 may each include wireless access points (APs) 121 and 123 for controlling communications within the respective areas 101 and 103. As shown, the APs 121, 123 are coupled to a wired network such as a LAN 125, which is further coupled to a common server computer 127.

Within the area 101, wireless devices 111 and 113 are able to communicate with each other via the AP 121, and within the area 103, wireless devices 115 and 117 are able to communicate with each other via the AP 123. The AP 121 enables the devices 111 and 113 to communicate to the server 127 via the LAN 125 and the AP 123 also enables the devices 115 and 117 to communicate to the server 127 via the LAN 125. It is further noted that the LAN 125 enables the devices 111, 113, 115 and 117 to communicate with each other and with any other device coupled thereto.

APs, if used, are usually connected to a wired LAN, such as the LAN 125, although they need not be. The number and location of APs usually depends on the particular configuration and needs, such as the number of users served, range of coverage, and/or adjacent channel interference. It is noted that a single AP can serve a whole floor of rooms subject to user density and interference. Multiple APs are used much like cells in cellular communication. Adjacent APs may operate on adjacent channels to prevent interference. Roaming capability may be enabled to allow devices to move from one area to another, such as from area 101 to 103 and vice versa. Generally, each AP has additional software and has access to house or building main power.

An alternative embodiment is shown by area 105 including devices 131, 133 and 135. The devices 131, 133 and 135 communicate directly with one another rather than via any APs. Networks without APs are ad hoc in nature and typically contain fewer clients. The primary difference between the devices 111, 113, 115 and 117 from the devices 131, 133 and 135 is the mode of operation. Each of the wireless devices 111, 113, 115, 117 and 131, 133, 135 includes a wireless transceiver that may be implemented according to an embodiment of the present invention for enabling wireless communications.

The devices 111, 113, 115, 117, 131, 133, and 135 may be any type of device that includes wireless communication capabilities. In an office or home environment for example, the devices may each comprise any one or more personal computers, laptop computers, desktop computers, etc., printing devices including any type of printer technology, personal digital assistants (PDAs) or the like, scanners, fax machines, etc. The use of wireless technology enables any of the devices to be located anywhere within a given area to communicate with, and transfer data and information between, other devices within the same communication area. For example, the device 111 may be a computer that wirelessly communicates to the device 113 which may be a printer. Further, the device 111, as a computer, may send and receive files to the server 127. The device 111 may be moved to the area 103 from area 101 and still maintain communication with the LAN 125 and the server 127 via the AP 121. The LAN 125 may comprise any type of wire technology, such as telephone wires, power wires, twisted-pair, coaxial cables, etc., and may be implemented according to any type of suitable architecture, such as any type of Ethernet configuration or the like. It is further noted that a wireless LAN 125 is contemplated, where the APs 121, 123 is include corresponding wireless transceivers and are mobile or portable devices. Within the area 105, the devices 131–135 themselves establish a wireless LAN (WLAN) for communicating to each other to in a similar fashion.

FIG. 2 is a simplified schematic and block diagram of a wireless transceiver 200 implemented according to an embodiment of the present invention that may be incorporated within any of the devices 111, 113, 115, 117, 131–135 and in either or both of the APs 121, 123. It is understood, however, that the wireless transceiver 200 is not limited to WLAN configurations, which are exemplary only, but instead may be employed in other types of radio or wireless communications for other types of applications. The wireless transceiver 200 is implemented as a zero intermediate frequency (ZIF) architecture including a ZIF transceiver 201 and a baseband processor 203. As described more fully below, the ZIF architecture enables a simplified configuration by entirely eliminating intermediate frequency (IF) logic and associated circuitry. In this manner, only two primary modules, chips, or ICs (transceiver and processor) are utilized in the ZIF architecture to enable wireless communications. This, in turn, significantly reduces the number of components, reduces cost and further reduces power consumption of the wireless transceiver 200 as compared to similar transceivers including IF circuitry and logic.

A problematic characteristic of traditional ZIF architectures is the introduction of substantial DC offset voltages in the receiver that must be compensated for or otherwise eliminated to capture incoming signals and allow communications. The wireless transceiver 200 is configured with an automatic gain control (AGC) loop 345 (FIG. 3) combined with a DC loop 347 to measure and reduce or otherwise eliminate undesired DC in the receiver. As described further below, the AGC loop 345 includes gain control logic that receives an amplified input signal, that estimates input signal power and that asserts a gain adjust signal in an attempt to keep the input signal power at a target power level. The DC loop 347 includes DC control logic that estimates an amount of DC in the amplified input signal and that provides a DC offset in an attempt to reduce DC in the amplified input signal. Also, a gain interface is provided that converts gain levels between the gain control logic and the DC control logic.

The wireless transceiver 200 may utilize any desired carrier frequency and modulation technique to achieve any of several corresponding data throughputs. For example, the wireless transceiver 200 may be configured to operate according to the Institute of Electrical and Electronics Engineers (IEEE) 802.11b with a carrier frequency of approximately 2.4 gigahertz (GHz) and with data throughputs of 1, 2, 5.5 or 11 Megabits per second (Mbps).

Alternatively, the wireless transceiver 200 may be configured according to IEEE 802.11a with a carrier frequency of approximately 5 GHz for data throughputs of 6, 12, 18, 24, 36 or 54 Mbps. In the embodiment shown, the wireless transceiver 200 operates in accordance with IEEE 802.11b at a carrier frequency of 2.4 GHz with data throughput rates of 1, 2, 5.5 or 11 Mbps. The direct sequence spread spectrum (DSSS) modulation technique is used in the embodiment shown, although it is understood that the present invention is not limited to any particular communication or modulation technique or standard.

Any of the devices 111–117 or 131–133 or the APs 121, 123 may be configured according to the wireless transceiver 200. The particular configuration depends upon the type of device and communication interface. The wireless transceiver 200 may be configured as a plug-in peripheral or expansion card that plugs into an appropriate slot or interface of a computer system. For example, for portables and laptop computers and the like, the wireless transceiver 200 may be implemented as a Personal Computer Memory Card International Association (PCMCIA) card or PC Card that plugs into a PC Card slot of the computer. The antenna may be incorporated on the PC Card itself, or provided externally or on the computer and interfaced to the PC Card in any appropriate manner. For desktop computers and the like, the wireless transceiver 200 may be implemented according to any type of expansion or peripheral standard, such as according to the peripheral component interconnect (PCI), the Industry Standard Architecture (ISA), the Extended-ISA (EISA) standard, etc. For example, the wireless transceiver 200 may be implemented on a PCI card that plugs into a PCI slot. Again, the antenna may be integrated or coupled externally. Mini PCI cards with antennas embedded in displays are also contemplated. Self-contained or standalone packaging with appropriate communication interface(s) is also contemplated, which is particularly advantageous for APs. For example, the wireless transceiver 200 may be implemented as a separate unit with serial or parallel connections, such as a Universal Serial Bus (USB) connection or an Ethernet interface (twisted-pair, coaxial cable, etc.), or any other suitable interface to the device.

Digital data sent from or received by the wireless transceiver 200 is processed through a medium access control (MAC) device 205. For transmission, the MAC device 205 asserts digital data signals to a packet encoder 207, which formulates the data into packets for transmission. In packet encoder 207, a packet is formed by the concatenation of three serial bit streams. The first serial bit stream, referred to as the preamble, is a 1 Mbps stream of ones or zeroes followed by a synchronization (sync) pattern. The second serial bit stream, referred to as the header, is a 1 or 2 Mbps stream of packet information, such as packet length and the data rate of the data portion of the packet. The third serial bit stream, referred to as the data portion or payload, is any selected one of 1, 2, 5.5, or 11 Mbps streams of data.

The packet encoder 207 provides baseband encoded packets to a spreading encoder (SPREAD) 209. In the embodiment shown, the 1 and 2 Mbps bit rates are encoded according to Barker word encoding spreading, whereas the 5.5 and 11 Mbps bit rates are encoded according to Complementary Code Keying (CCK) encoding. The spreading encoder 209 uses a quadrature generation technique and provides in phase (I) and quadrature (Q) signals on respective I and Q channels. For 1 Mbps, every bit in 11 chips of a Barker word are output identically on the I and Q channels. If the input bit is zero, then the sense of the 11 chips is inverted, and if the input bit is one, the sense of the 11 chips is not inverted. The data is thus spread by the Barker code. For 2 Mbps, for every two bits input, 11 chips are output on each of the I and Q channels. One bit is used to invert or not the I channel and the other bit is used for the Q channel. For 5.5 Mbps, 4 bits are mapped to 8 complex (I and Q channel) chips. 8 chip complex code words are chosen and then rotated according to specific rules defined in the standard. 11 Mbps is similar to 5.5 Mbps, except that 8 bits are mapped to 8 complex chips.

The I channel signal is provided to an I digital-to-analog converter (I DAC) 211 and the Q channel signal is provided to a Q DAC 213, where the I DAC 211 and the Q DAC 213 also receive a clock signal CREF from a clock source 257. In one embodiment, the CREF signal is 44 MHz based on the 22 MHz fundamental for IEEE 802.11b. The I DAC 211 and the Q DAC 213 up-sample and digitally filter the I and Q channel signals, respectively. For 11 Mbps, the I and Q DACs convert each chip to four samples. The I DAC 211 asserts an I channel analog output signal to an anti-aliasing low-pass filter (AA LPF) 215, which provides an I channel transmit signal TX1 to an LPF 219 within the ZIF transceiver 201. The Q DAC 213 asserts a Q channel analog output signal to another AA LPF 217, which provides a Q channel transmit signal TXQ to the input of another LPF 221 within the ZIF transceiver 201.

An external voltage controlled oscillator (VCO) 229 provides an output local oscillator (LO) signal at approximately 4.8 GHz to a phase lock loop (PLL) 231 and an input of an I/Q LO generator 227. In one embodiment, a reference crystal is used to tune the VCO 229 by a voltage control to generate the 4.8 GHz LO signal. The PLL 231 receives the CREF clock signal which is divided down to an appropriate low frequency signal. The PLL 231 also divides down the VCO 4.8 GHz signal to the same appropriate low frequency signal. A phase detector circuit (not shown) within the PLL 231 compares these two low frequency signals—one being the CREF signal and the other from the VCO 229, and generates a correction (C) signal which after filtering is input to the VCO 229. This phase locked loop system reduces jitter on the VCO output LO signal. The I/Q LO 227 divides the 4.8 GHz carrier signal from the PLL 231 by two and generates two separate 2.4 GHz carrier signals, including an in-phase (I) carrier signal, and a quadrature (Q) carrier signal. The I and Q carrier signals are 90 degrees out of phase with respect to each other. The I carrier signal is provided to one input of an I channel mixer 223, and the Q carrier signal is provided to one input of a Q channel mixer 225. The other input of the I channel mixer 223 receives the output of the LPF 219 and the other input of the Q channel mixer 225 receives the output of the LPF 221. The I channel mixer 223 combines the I carrier signal with the I channel transmit signal to up-convert the I channel from baseband to 2.4 GHz radio frequency (RF). The Q channel mixer 225 combines the Q carrier signal with the Q channel transmit signal to up-convert the Q channel from baseband to 2.4 GHz RF. The outputs of the I/Q channel mixers 223, 225 are combined at the input of a variable gain amplifier (VGA) 233. The VGA 233 asserts an amplified transmit signal to the input of a fixed-gain amplifier 235, which provides its output to a radio frequency power amplifier (RFPA) 237. The RFPA 237 asserts an amplified RF signal to an RF LPF 239, which provides a filtered RF output signal to one input of a transmit/receive (T/R) switch 241. For transmission, the T/R switch 241 provides the RF output of the LPF 239 to a bi-directional band pass filter (BPF) 243, which provides a filtered RF output to a diversity switch 245. The diversity switch 245 asserts the RF transmit signal on a selected one of two antennas 247, 249.

The RFPA 237 asserts a transmit detect (TX DET) signal back to a transmit analog-to-digital converter (ADC) 251 within the baseband processor 203, which provides a corresponding digital feedback signal to the MAC 205. The MAC 205 includes a power control algorithm that detects the transmitted output signal via the ADC 251 and provides a feed forward signal to the input of a transmit (TX) DAC 253, which asserts a transmit automatic gain control (TX AGC) signal to control the gain of the VGA 233. Further, the ZIF transceiver 201 includes a voltage reference source 255 to provide a voltage reference (VREF) signal for the ZIF transceiver 201 and for the baseband processor 203. The VREF signal may be any convenient voltage, such as 1.2 volts or the like. The clock source 257 provides the CREF signal to the PLL 231 within the ZIF transceiver 201.

The T/R switch 241 is selected to receive signals from either of the antennas 247, 249 and provides a filtered signal (through BPF 243) to the input of a balanced/unbalanced (BALUN) impedance matching network 259. The BALUN 259 provides a received RF input signal $R_{RF}$ to the input of a variable LNA 261. The LNA 261 asserts its output to the input of a fixed-gain LNA 263. The LNA 263 asserts the amplified RF receive signal to respective inputs of an I channel mixer 265 and a Q channel mixer 267. The I/Q LO 227 asserts the I carrier signal to another input of the I channel mixer 265 and the Q carrier signal to another input of the Q channel mixer 267. The I channel mixer 265 splits the I carrier frequency from the I channel output signal in the RF receive signal and provides the I channel output signal to an LPF 269. In a similar manner, the Q channel mixer 267 splits the Q carrier frequency from the Q channel output signal in the RF receive signal and provides the Q channel output signal to an LPF 271.

The output of the LPF 269 is provided to the input of a variable baseband automatic gain control (BB AGC) amplifier 273. In a similar manner, the LPF 271 asserts its output to the input of another BB AGC amplifier 275. The BB AGC amplifier 273 asserts an amplified I channel analog receive signal (RXI) to the input of an I channel receiver AA LPF 277, which asserts its output to the input of an I channel ADC (I ADC) 281 within the baseband processor 203. The BB AGC amplifier 275 asserts an amplified Q channel analog receive signal (RXQ) to the input of a Q channel AA LPF 279, which provides its output to an input of a Q channel ADC (Q ADC) 283 within the baseband processor 203. The I ADC 281 and the Q ADC 283 assert respective I and Q channel digital receive signals $R_{DI}$, $R_{DQ}$ to a spreading decoder (DE-SPREAD) 285, which performs the opposite process as the spreading encoder 209 to retrieve received baseband encoded packets. The spreading decoder 285 provides the received baseband packets to a packet decoder 287, which, among other functions, retrieves the packet payloads and generates a stream of received data signals. The $R_{DI}$ and $R_{DQ}$ signals are also provided to compensation logic 284, further described below. The data signals from the packet decoder 287 are provided to a receive input of the MAC device 205, which provides received signals to the corresponding device across the implemented interface. The MAC interface may be incorporated internally within a device, such as on a PC CARD or the like, or may be external with appropriate external connectors, such as according to USB or the like.

An overload detector (OD) 289 within the ZIF transceiver 201 has first and second inputs coupled to the respective outputs of the LPF 269 and LPF 271 to detect an overload in the received input signal. The overload detector 289 asserts a baseband overload (BB OVLD) signal to an OVLD ADC 291 within the baseband processor 203, which provides a corresponding digital overload signal OVLD to the compensation device 284. In this manner, the compensation device 284 detects an overload of the received signal and asserts a HI/LO signal to control the variable LNA 261 of the ZIF transceiver 201. In the embodiment shown, the variable LNA 261 has an approximate 33 decibel (dB) step differential between a high gain (HI) and a low gain (LO). The gain is initially set high to detect weak signals and is switched to low gain upon certain conditions if the receive signal causes an overload condition as detected by the overload detector 289.

As more fully described below, the compensation device 284 controls the gain of the received signal to a target power level by asserting a gain adjust signal $G_{ADJ}$ to a gain DAC referred to as the AGC DAC 297. The AGC DAC 297 asserts a corresponding analog feedback gain control signal GAIN ADJUST to control the gain of both of the BB AGC amplifiers 273, 275. A single gain control signal is provided to both of the BB AGC amplifiers 273, 275 so that the gain of the I and Q channels of the receive signal appropriately track one another. The compensation device 284 further asserts respective digital I and Q channel DC offset signals $IDC_{OFF}$, $QDC_{OFF}$ to an I channel offset (I OFF) DAC 293 and a Q channel offset (Q OFF) DAC 295, respectively. The I OFF DAC 293 asserts an I channel DC offset analog signal (I OFFSET) to the LPF 269 and the Q OFF DAC 295 asserts a Q channel DC offset analog signal (Q OFFSET) to the LPF 271. In this manner, the compensation device 284 attempts to measure and reduce or otherwise eliminate DC offsets in both the I and Q channels of the receive signal within the ZIF transceiver 201.

A ZIF architecture is utilized to obtain sufficient performance and higher data throughput at lower cost and power consumption. This is particularly advantageous to the consumer market which demands multimedia and DVD applications requiring relatively good performance. The consumer market also demands a lower cost. The ZIF architecture is one way to achieve lower cost with sufficient performance by eliminating IF components and external filters. The target carrier frequencies are in the GHz range such as 2–5 GHz ranges and higher, although the present invention is not limited to any particular frequency range. The 2–5 GHz bands are relatively noisy with significant amounts of interference. The ZIF architecture is utilized to maintain a level of performance in a noisy environment.

A particular problem with the ZIF architecture is the development of DC offsets at baseband that degrade signal-to-noise (SNR) ratio, which is directly related to performance of the system. The IF stage, which may be utilized to combat a significant level of DC offset, is not provided in the ZIF architecture. A number of sources of DC offset are due to temperature change, such as die self-heating of integrated circuits. The receive mixers 265, 267 internally inject DC offset from the carrier frequencies generated by the I/Q LO 227. This LO DC offset varies with RF frequency or channel selection as well as a selected level of gain of the variable LNA 261. This change occurs very quickly with changes of channel or gain. A slow DC drift with temperature also occurs. Externally, the LO carrier frequencies from the I/Q LO 227 leaks to the antenna input port causing DC offset. This external DC offset varies with changes in the external environment, such as movement of hands, bodies, jewelry, mouse pointers, activation of electronic devices such as cooling fans or the like and re-radiation from nearby reflectors around the antenna. Movement of the wireless devices or changes in antenna direction also causes significant changes of the propagation characteristics of the channel or area. Such environmental changes induce impedance changes that dynamically change LO leakage magnitude and phase.

The receive mixers 265, 267 also exhibit DC offsets at their outputs. This DC offset is primarily a function of circuit matching, such as bipolar and Metal Oxide Semiconductor (MOS) device matching and resistor matching. This DC offset also drifts due to temperature variations and self-heating. The I and Q channel LPFs 269, 271 also exhibit offset at their outputs. This DC offset is also primarily a function of circuit matching. The I and Q channel baseband AGC amplifiers 273, 275 also exhibit DC offset at their inputs. This DC offset is also primarily a function of circuit matching. Due to the analog control circuitry associated with this function, the impact of matching variation is more severe than the DC offset experienced by the receive mixers 265, 267 and the LPFs 269, 271. This DC offset also changes non-linearly with gain setting, and drifts due to temperature variation and self-heating. The control voltage versus gain characteristic may also vary slowly with time. The main reason for drift is slower package temperature variations. A certain level of DC offset due to internal radio jamming from harmonics of digitally generated signals also occurs. As radio jamming is injected into the antenna and/or RF front end, this DC offset is a function of channel and LNA gain as well as a strong function of the particular digital circuit that is creating the spurious signal. Below a certain frequency (f) such as 1 kilohertz (kHz), 1/f noise appears as an impairment similar in effect to DC offsets.

It is noted that one possible solution of removing DC offset is through AC coupling, such as using coupling capacitors or the like. However, AC coupling results in filtering that tends to filter out low frequency content. The amount of data thrown away becomes significant above 1 kHz, so that AC coupling must only filter below 1 kHz. Within this range, however, the settling time is too long, such as on the order of approximately 100 microseconds ($\mu$s), which is not practical in a bursty environment such as packet-based communications. The settling time is limited due to the bursty nature of communication. Short preamble time lines of IEEE 802.11a and IEEE 802.11b standards have little room for accurate DC estimation.

All of the sources of DC offsets are referenced to the inputs of the BB AGC amplifiers 273, 275. The gain range of the BB AGC amplifiers 273, 275 must be sufficient to guarantee acceptable performance in a variety of environments. In the embodiment shown, the gain range of each of the BB AGC amplifiers 273, 275 is approximately −6 dB to 60 dB, or 0.5 V/V to 1000 V/V to obtain the desired operation range of approximately 0.7 V/V to 800 V/V. It has been determined that the DC offset range can be on the order of ±50–100 millivolts (mV). It is desired that the DC correction occur before the baseband amplifiers 273, 275 because of its significant gain range.

FIG. 3 is a block diagram of a compensation system 300 utilized to control the gain of the received signal and to reduce or eliminate DC offsets in the ZIF architecture. The compensation system 300 illustrates operation of the receive portion of the wireless transceiver 200 for purposes of gain and DC compensation. The compensation system 300 includes various blocks representative of the elements within the wireless transceiver 200, including circuitry from the ZIF transceiver 201 and the baseband processor 203, with a focus on the operations of the compensation logic 284. The block diagram of the compensation system 300 is simplified in that the separate I and Q channel signals are illustrated by single communication path, which represents operation of both I and Q channels. Thus, it is noted that the same techniques are applied for both the I and Q channels and thus are applicable for use in the wireless transceiver 200.

The received RF input signal $R_{RF}$ from the antennas 247, 249 through the BALUN 259 is provided to an RF mixer circuit referred to as the LNA/mixer 301, which represents the LNAs 261, 263 and the receive mixers 265, 267. The LNA/mixer 301 provides a baseband receive input signal $R_{BB}$ to one input of a combiner 303, which provides a DC-adjusted receive input signal $R_{ADJ}$ to the input of a baseband BB LPF 305 representing the LPFs 269, 271. The other input of the combiner 303 receives a DC OFFSET signal. The combiner 303 operates as a combiner that combines the DC OFFSET signal with the $R_{BB}$ receive signal to provide the DC-adjusted $R_{ADJ}$ signal. In one embodiment, the combiner 303 is a summing junction that subtracts the DC OFFSET signal from the $R_{BB}$ receive signal to provide the DC-adjusted $R_{ADJ}$ signal. It is noted that the combiner 303 may alternatively operate as a summing junction that adds an inverted DC OFFSET signal. The invention is not limited to any particular implementation or design configuration.

The output of the BB LPF 305 is provided to the input of a baseband gain amplifier BB AGC amplifier 307, representing operation of the BB AGC amplifiers 273, 275. The output of the BB LPF 305 is also provided to the overload detector 289, which asserts the baseband overload signal BB OVLD to the OVLD ADC 291 within the baseband processor 203, which provides the OVLD signal to an overload (OV) detect block 309 of the compensation device 284. The OV detect block 309 asserts the HI/LO signal to the LNA/mixer 301 to switch the variable LNA 261 between high and low gains. The BB AGC amplifier 307 asserts the amplified input signal R to the input of an AA LPF 311 representing the AA LPFs 277, 279. The output of the AA LPF 311 is provided to an ADC 313 representing the ADCs 281, 283. The ADC 313 provides a digital version $R_D$ of the amplified receive input signal R at its output, where the $R_D$ signal represents the I and Q digital receive signals $R_{DI}$ and $R_{DQ}$. The $R_D$ signal from the ADC 313 is provided to the spreading decoder 285.

The $R_D$ signal is provided to a signal power estimate block 315 and a DC estimate block 319 of the compensation logic 284. The signal power estimate block 315 provides a input signal power estimate signal $R_{EST}$ to one input of a combiner 321. The combiner 321 receives a target power (TP) signal from a target power block 323 and combines the TP signal with the $R_{EST}$ signal to provide a receive error signal $R_E$, which is provided to an input of another combiner 325. In one embodiment, the combiner 321 operates as a summing junction that subtracts the TP signal from the $R_{EST}$ signal to provide a receive error signal $R_E$ to an input of the combiner 325. The combiner 325 combines the $R_E$ signal with a gain accumulation signal $G_{ACC}$ from an accumulator 329 to provide the gain adjust signal $G_{ADJ}$ at its output. In one embodiment, the combiner 325 also operates as a summing junction that subtracts the $R_E$ signal from the gain accumulation signal $G_{ACC}$ from an accumulator 329 to provide the gain adjust signal $G_{ADJ}$ at its output. The $G_{ADJ}$ signal is provided to the respective inputs of the AGC DAC 297, the accumulator 329 and a gain converter 331. The AGC DAC 297 converts the digital $G_{ADJ}$ signal to the analog GAIN ADJUST signal, which controls the gain of the BB AGC amplifier 307. The accumulator 329 continuously or periodically adjusts the $G_{ACC}$ signal to track changes of the $G_{ADJ}$ signal.

The DC estimate block 319 provides an output DC estimate digital signal $ODC_{EST}$ to the input of a DC amplifier 333, which is adjusted by a gain conversion signal $G_{CON}$ from an output of the converter 331. The DC amplifier 333 amplifies or attenuates (1/G) the $ODC_{EST}$ signal by an amount determined by the $G_{CON}$ signal from the converter 331, and provides an input DC estimate signal $IDC_{EST}$ to one input of a combiner 335, which receives a DC offset accumulation signal $D_{ACC}$ from an accumulator 339 at its other input. The combiner 335 combines the $IDC_{EST}$ signal with the $D_{ACC}$ signal to provide a DC offset signal $DC_{OFF}$, which is provided to the input of a DC DAC 337 and to the input of the DC accumulator 339. In one embodiment, the combiner 335 operates as a summing junction that adds the $IDC_{EST}$ signal to the $D_{ACC}$ signal to provide the DC offset signal $DC_{OFF}$. The accumulator 339 continuously adjusts the $D_{ACC}$ signal to the level of the $DC_{OFF}$ signal to maintain an accumulated DC value. The DC DAC 337 converts the digital $DC_{OFF}$ signal to the analog DC OFFSET signal provided to the combiner 303. The $DC_{OFF}$ signal represents operation of the $IDC_{OFF}$ and $QDC_{OFF}$ signals and the DC OFFSET signal represents operation of the I OFFSET and Q OFFSET signals.

It is noted that many alternatives and variations are contemplated. For example, the combiner 303 may be implemented as a simple summing junction, where the DC amplifier 333 or the DC DAC 337 performs negation or inversion to generate a negative DC OFFSET signal, which is then added to the $R_{BB}$ signal by the combiner 303.

Control logic 343 is coupled to the OV detect block 309, the target power block 323 and the DC estimate block 319 for controlling operations, setting parameters, etc. For example, the control block 343 may be used to enable a manufacturer or user to set a target power level used by the target power block 323 to control the TP signal.

In operation, the $R_{RF}$ signal from the antennas 247, 249 is converted to the $R_{BB}$ signal at baseband frequency by the LNA/mixer 301. The OV detect block 309 initially sets the gain of the LNA portion of the LNA/mixer 301 high by asserting the HI/LO signal to HI in order to ensure detection of a valid but weak RF signal received by either of the antennas 247, 249. The $R_{BB}$ signal is DC adjusted by the combiner 303, which combines or otherwise subtracts the DC OFFSET signal and provides the $R_{ADJ}$ signal to the BB LPF 305. The BB LPF 305 provides a filtered version of the $R_{ADJ}$ signal to the BB AGC amplifier 307. The DC OFFSET signal is based on an estimate of the amount of undesired DC at the input of the BB AGC amplifier 307. The overload detector 289 detects whether an overload condition of the received input signal at the output of the BB LPF 305 exists, and if so, asserts the BB OVLD signal. If an overload condition is detected, the OV detect block 309 asserts the HI/LO signal to LO to reduce the input gain of the LNA/mixer 301 to bring the received input signal $R_{BB}$ closer to a target power level.

The BB AGC amplifier 307 amplifies the $R_{ADJ}$ signal to provide the R signal to the AA LPF 311 and then to the ADC 313 of the baseband processor 203. The ADC 313 converts the analog R signal to the digital receive signal $R_D$, which is provided to the spreading decoder 285 (as the $R_{DI}$ and $R_{DQ}$ signals). The signal power estimate block 315, the combiners 321 and 325, the target power block 323, the accumulator 329 and the AGC DAC 297, in combination with the signal path devices including the BB AGC amplifier 307, the AA LPF 311 and the ADC 313, form the AGC loop 345, which is a gain feedback circuit centered around the BB AGC amplifier 307. The AGC loop 345 includes gain control logic that receives the amplified input signal, that estimates input signal power and that asserts the gain adjust signal in an attempt to keep the input signal power at a target power level. In particular, the signal power estimate block 315 estimates the power of the baseband input signal within the $R_D$ signal and asserts the $R_{EST}$ signal indicative thereof. In one embodiment, this power estimate excludes any DC level of the $R_D$ signal. The combiner 321 compares the $R_{EST}$ signal with the TP signal to generate the $R_E$ signal, which identifies an amount of power error of the $R_D$ signal relative to the target power level represented by the TP signal. The combiner 325 adjusts the present value of the $G_{ADJ}$ signal in an attempt to compensate for any power error that exists. The AGC DAC 297 converts the $G_{ADJ}$ signal to the analog GAIN ADJUST signal, which is provided to the gain control input of the BB AGC amplifier 307 to control the power level of baseband input signal within the $R_D$ signal. Thus, the AGC loop 345 attempts to maintain or otherwise regulate the power level of the input baseband signal within the $R_D$ signal to the target power level.

In the embodiment shown, the BB AGC amplifier 307, representing either of the BB AGC amplifiers 273, 275, uses a logarithmic gain scale, such as measured in dB, that ranges between −6 and 60 dB. The $R_D$ signal is in digital format, so the signal power estimate block 315, the target power block 323, the accumulator 329 and the combiners 321, 325 are digital devices and the $R_{EST}$, TP, $R_E$, $G_{ACC}$ and $G_{ADJ}$ signals are digital signals. The AGC DAC 297 is a 7-bit DAC with 128 steps that outputs an analog current signal with a control current range of approximately ±1 mA to achieve the desired gain range for the BB AGC amplifier 307. The current output of the AGC DAC 297 is converted to a voltage signal, such as by a resistive network or the like (not shown), to obtain the GAIN ADJUST signal.

The DC estimate block 319, the gain converter 331, the DC amplifier 333, the combiner 335, the accumulator 339, the DC DAC 337 and the combiner 303, in combination with the receive signal path between the combiner 303 and the ADC 313, form a DC loop 347 that operates to attempt to reduce or otherwise remove DC from the $R_D$ signal in the input signal path. The DC loop 347 includes DC control logic that estimates an amount of DC in the amplified input signal and provides a DC offset in an attempt to reduce DC in the amplified input signal. In particular, the DC estimate block 319 estimates the DC offset of the $R_D$ signal, and provides the $ODC_{EST}$ signal indicative of the amount of DC at the output of the BB AGC amplifier 307. Since the DC OFFSET signal is applied at the combiner 303 at the input of the BB AGC amplifier 307, and since any remaining DC of the $R_{ADJ}$ signal is effectively amplified by the BB AGC amplifier 307, the DC amplifier 333 operates to compensate for the gain of the BB AGC amplifier 307. The gain converter 331, receiving the $G_{ADJ}$ signal and generating the $G_{CON}$ signal that controls the gain of the DC amplifier 333, operates as a gain interface that converts gain levels between the gain control logic and the DC control logic. In one embodiment, the gain converter 331 inverts the gain (1/G). The gain converter 331 may further compensate for different gain ranges and/or different gain scales between the BB AGC amplifier 307 and the DC amplifier 333. In this manner, the $IDC_{EST}$ signal, asserted by the DC amplifier 333, represents an error of the DC OFFSET signal. The combiner 335 adjusts the $DC_{OFF}$ signal, maintained by the accumulator 339 as the $D_{ACC}$ signal, by the $IDC_{EST}$ signal to compensate for errors in the DC OFFSET signal.

In the embodiment shown, the $R_D$ signal is in digital format, so the DC estimate block 319, the DC amplifier 333, the accumulator 339 and the combiner 335 are digital devices and the $ODC_{EST}$, $IDC_{EST}$, $D_{ACC}$ and $DC_{OFF}$ signals are digital. Also, the DC DAC 337, representing either of the I, Q OFF DACs 293, 295, is a 12-bit, current-based DAC operated in 2's-complement format that outputs an analog current with an approximate range of ±5 milliamps (mA). The DAC output current is converted to the DC OFFSET voltage signal having a range of approximately ±75 mV to compensate for an expected DC offset range of approximately ±64 mV. The gain converter 331 may operate entirely as a digital device to convert the digital $G_{ADJ}$ signal to a digital $G_{CON}$ signal. Alternatively, it is contemplated that the $G_{CON}$ signal is an analog signal depending upon the configuration of the DC amplifier 333. In the embodiment shown, the DC amplifier 333 is a linear gain amplifier. In general, the BB AGC amplifier 307 amplifies the input signal including any DC, so that the DC amplifier 333 operates as an amplifier that amplifies the $ODC_{EST}$ signal to maintain control of the DC loop 347. The amount of amplification by the DC amplifier 333 is controlled by the gain converter 331 via the $G_{CON}$ signal. The gain converter 331 receives the $G_{ADJ}$ signal and adjusts the $G_{CON}$ signal accordingly.

As described previously, the gain converter 331 operates as a gain interface that converts gain levels between the gain control logic and the DC control logic. In one embodiment, the gain converter 331 inverts the gain between the BB AGC amplifier 307 and the DC amplifier 333. The gain converter 331 may further convert between the corresponding ranges or units along with any bit weighting of the $G_{ADJ}$ and $G_{CON}$ signals so that the amplification of the $ODC_{EST}$ signal corresponds to the gain of the $R_{ADJ}$ signal. In the alternative or in addition, the gain converter 331 further converts between gain scales, such as between logarithmic and linear scales. In particular for the embodiment shown, since the BB AGC amplifier 307 is a logarithmic gain amplifier measured in decibels (dBs) and since the DC amplifier 333 is a linear gain amplifier, the gain converter 331 converts from the $G_{ADJ}$ signal in dBs to the linear gain $G_{CON}$ signal. For embodiments in which the BB AGC amplifier 307 and the DC amplifier 333 are both linear amplifiers, the gain converter 331 converts between the corresponding ranges or units along with any bit weighting of the $G_{ADJ}$ and $G_{CON}$ signals without need of logarithmic conversion.

It is appreciated that removal of the IF portion of a high performance wireless transceiver, with proper DC compensation, results in a relatively high performance, low cost wireless ZIF transceiver with reduced power requirements. The use of a DC compensation loop interfaced to the gain loop according to embodiments of the present invention achieves these goals. Estimation of DC at the output of the baseband gain amplifier and amplification of the DC estimate based on a gain conversion linked with the gain loop provides a DC offset at the input to effectively control DC provided to the baseband processor decoder devices. Such capability enables a WLAN system to be designed for use at home or in the small business that is relatively robust and that has significant performance with relatively high data throughput operation. A ZIF design in accordance with embodiments of the present invention provides high sensitivity and allows for fast settling of the gain and DC offset loops. Fast settling is desirable because of the bursty and packetized nature of communications. The design also contends well with large amounts of inherent noise which is averaged out or otherwise eliminated in order to compensate for DC offsets.

Although a system and method according to the present invention has been described in connection with one or more preferred embodiments, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A DC compensation system for a wireless communication device configured in a zero intermediate frequency (ZIF) architecture, comprising:
    a combiner that combines a DC offset signal with an input signal and that provides an adjusted input signal;
    a gain amplifier that receives the adjusted input signal and that provides an amplified input signal based on a gain adjust signal;
    a gain feedback circuit that receives the amplified input signal, that estimates input signal power and that provides the gain adjust signal in an attempt to maintain the input signal power at a target power level;
    a DC estimator that estimates a DC level in the amplified input signal and that provides a DC estimate signal;
    a DC amplifier that receives the DC estimate signal and that provides the DC offset signal based on a gain conversion signal; and
    a gain converter that receives the gain adjust signal and that provides the gain conversion signal to the DC amplifier.

2. The DC compensation system of claim 1, wherein the gain converter converts between gain ranges of the gain amplifier and the DC amplifier.

3. The DC compensation system of claim 1, further comprising:
    the gain amplifier having a logarithmic gain scale;
    the DC amplifier having a linear gain scale; and
    the gain converter converting between the logarithmic and linear gain scales.

4. The DC compensation system of claim 1, further comprising:
    an analog to digital converter that converts the amplified input signal into a digital input signal;
    the DC estimator estimating a DC level of the digital input signal and providing a digital DC estimate signal;
    the DC amplifier receiving the digital DC estimate signal and providing a digital DC offset signal; and
    a DC digital to analog converter that converts the digital DC offset signal to a corresponding analog DC offset voltage and that provides the analog DC offset voltage to the combiner.

5. The DC compensation system of claim 4, further comprising:
    the gain feedback circuit receiving the digital input signal and providing a digital gain adjust signal;
    a gain DAC that converts the digital gain adjust signal to an analog gain adjust signal that controls gain of the gain amplifier; and
    the gain converter receiving the digital gain adjust signal and providing a digital gain conversion signal to control the gain of the DC amplifier.

6. A wireless communication device, comprising:
    a ZIF transceiver, comprising:
        an RF mixer circuit that converts an RF signal to a baseband input signal;
        a combiner that combines a DC offset with the baseband input signal to provide an adjusted baseband input signal; and a baseband amplifier that receives the adjusted baseband input signal and that asserts an amplified input signal based on a gain adjust signal; and a baseband processor, comprising:

gain control logic that receives the amplified input signal, that estimates input signal power and that asserts the gain adjust signal in an attempt to keep the input signal power at a target power level;

DC control logic that estimates an amount of DC in the amplified input signal and that provides the DC offset in an attempt to reduce DC in the amplified input signal; and a gain interface that converts gain levels between the gain control logic and the DC control logic.

7. The wireless communication device of claim 6, further comprising:

the DC control logic further comprising:

a DC estimator that estimates an amount of DC in the amplified input signal and that provides a DC estimate signal; and a DC amplifier that receives the DC estimate signal and that provides the DC offset based on a gain conversion signal; and the gain interface including a gain converter that receives the gain adjust signal and that provides the gain conversion signal.

8. The wireless communication device of claim 7, wherein the gain converter converts between gain ranges of the baseband amplifier and the DC amplifier.

9. The wireless communication device of claim 7, further comprising:

the baseband amplifier having a logarithmic gain scale;

the DC amplifier having a linear gain scale; and the gain converter converting between the logarithmic and linear gain scales.

10. The wireless communication device of claim 6, further comprising:

the ZIF transceiver asserting the amplified input signal as an analog signal; and the baseband processor further comprising:

an analog to digital converter that converts the amplified input signal to a digital input signal;

the gain control logic receiving the digital input signal and providing a digital gain adjust signal;

a gain digital to analog converter (DAC) that receives the digital gain adjust signal and that provides the gain adjust signal to the baseband amplifier;

the DC control logic receiving the digital input signal and providing a digital DC offset signal; and a DC DAC that receives the digital DC offset signal and that provides the DC offset to the combiner.

11. The wireless communication device of claim 6, wherein:

the RF signal includes in-phase (I) and quadrature (Q) portions;

the RF mixer circuit including I and Q channel mixer circuits, each splitting the RF signal into respective I and Q baseband input signals;

the combiner including I and a Q channel combiners that subtract respective I and Q DC offsets from the I and Q baseband input signals, respectively, to provide I and Q adjusted baseband input signals;

the baseband amplifier including I and Q channel amplifiers that receive the I and Q adjusted baseband input signals, respectively, and that assert I and Q amplified input signals, respectively, based on the gain adjust signal;

the DC control logic estimating an amount of DC in each of the I and Q amplified input signals and providing the I and Q DC offsets in an attempt to reduce DC in the I and Q channels, respectively; and the gain interface comprising I and Q interfaces that each convert gain levels between the gain control logic and the DC control logic.

12. A method of reducing DC in a wireless zero intermediate frequency (ZIF) device, comprising:

converting a received radio frequency (RF) signal to a baseband signal;

combining a DC offset with the baseband signal to achieve an adjusted baseband signal;

amplifying the adjusted baseband signal based on a gain signal to achieve an amplified input signal;

estimating a power level of an input baseband signal from the amplified input signal;

adjusting the gain signal to achieve a target power level of the input baseband signal;

measuring a DC level of the amplified input signal to obtain a DC estimate;

amplifying the DC estimate based on a gain conversion signal to provide the DC offset; and generating the gain conversion signal based on the gain signal.

13. The method of claim 12, wherein the generating the gain conversion signal comprises converting between gain ranges.

14. The method of claim 13, wherein the generating the gain conversion signal further comprises converting between logarithmic and linear gain scales.

15. The method of claim 12, wherein the combining a DC offset from the baseband signal comprises subtracting the DC offset from the baseband signal.

16. The method of claim 12, wherein the amplifying the DC estimate comprises attenuating the DC estimate to provide the DC offset.

17. The method of claim 16, wherein:

the attenuating the DC estimate further comprises inverting the DC estimate to provide the DC offset; and wherein the combining a DC offset from the baseband signal comprises adding the DC offset to the baseband signal.

* * * * *